(12) United States Patent
Feil et al.

(10) Patent No.: US 6,352,815 B1
(45) Date of Patent: Mar. 5, 2002

(54) PRODUCTION OF LARGE-FORMAT COMPOSITE RELIEF PRINTING PLATES BY LASER POSITIONING AND SUBSEQUENT IMAGE RECORDING BY MEANS OF A LASER

(75) Inventors: Markus Feil, Stuttgart; Albrecht Weidmann, Kehl; Thomas Telser, Weinheim, all of (DE)

(73) Assignee: BASF Drucksysteme GmbH, Stuttgart (DE)

( * ) Notice: Subject to any disclaimer, the term of this patent is extended or adjusted under 35 U.S.C. 154(b) by 0 days.

(21) Appl. No.: 09/459,649

(22) Filed: Dec. 13, 1999

(30) Foreign Application Priority Data

Dec. 23, 1998 (DE) .......................... 198 59 631

(51) Int. Cl.⁷ .................................. G03F 7/09
(52) U.S. Cl. ............... 430/306; 430/273.1; 430/281.1; 430/22
(58) Field of Search ............... 430/306, 273.1, 430/281.1, 22

(56) References Cited

U.S. PATENT DOCUMENTS

| 4,515,877 A | 5/1985 | Barzynski et al. ............ 430/5 |
| 5,262,275 A | 11/1993 | Fan ............................ 430/273 |
| 5,925,490 A * | 7/1999 | Loerzer et al. ............ 430/156 |
| 6,037,102 A * | 3/2000 | Loerzer et al. ............ 430/306 |

FOREIGN PATENT DOCUMENTS

| EP | 465 949 | 1/1992 |
| WO | WO 94/03839 | 2/1994 |
| WO | 97/25206 | 7/1997 |
| WO | 98/01792 | 1/1998 |

OTHER PUBLICATIONS

JP 63–109052, Platemaking process with ink jet . . . Horiike et al.

* cited by examiner

Primary Examiner—Janet Baxter
Assistant Examiner—Barbara Gilmore
(74) Attorney, Agent, or Firm—Keil & Weinkauf

(57) ABSTRACT

Large-format composite relief printing plates are produced by applying individual photopolymerizable relief printing plates to a large-format substrate, by a process in which the image information is transmitted to the individual relief printing plates by means of a laser. The individual photopolymerizable relief printing plates are positioned on the substrate with the aid of a laser. A composite of relief printing plates comprises a substrate, a laser-structurable layer applied thereon and insoluble in printing inks and printing plate developers, and relief printing plates applied thereon and having an IR-ablatable layer.

13 Claims, No Drawings

PRODUCTION OF LARGE-FORMAT COMPOSITE RELIEF PRINTING PLATES BY LASER POSITIONING AND SUBSEQUENT IMAGE RECORDING BY MEANS OF A LASER

The present invention relates to a process for the production of large-format composite relief printing plates by applying individual photopolymerizable relief printing plates to a large-format substrate, the image information being transmitted to the individual relief printing plates by means of a laser. The present invention furthermore relates to a process in which the individual photopolymerizable relief printing plates are positioned on the substrate with the aid of a laser. The present invention also relates to a composite of relief printing plates comprising a substrate, a laser-structurable layer applied thereon and insoluble in printing inks and printing plate developers, and relief printing plates applied thereon and having an IR-ablatable layer.

For printing on very large surfaces with relief printing plates, for example on corrugated board for cardboard packaging with flexographic printing plates, correspondingly large printing plates are required. These are difficult to handle and are expensive. Frequently, printing is to be effected on only one or more small portions of a large total area. The following procedure is customary for this purpose: the printing plates required for the portions to be printed on are produced from individual, small photopolymer printing plates and adhesively bonded to a mounting sheet in the position where the printed image is to appear within the total area. The mounting sheet with the individual plates bonded thereon is hooked into the printing cylinder by means of an angle bar fastened to it and is fastened to said printing cylinder in a defined position. In the case of multicolor printing, such a mounting sheet with corresponding plates is produced for each color.

However, the mounting of the printing plates is extremely time-consuming and labor-intensive. In the case of multicolor compositions, mounting must be carried out with very exact positioning so that the various color dots precisely match one another in the print. Mounting exactly to the dot has to date required mounting apparatuses with video cameras for detection of the register marks. Mounting exactly in register must be tested in a complicated procedure by superposed printing in a proof press. If a color is not printed exactly in register, then the corresponding printing plate must be removed from the mounting sheet and stuck on again in an improved position. After such a correction, proof printing of all colors for a further check is necessary again.

WO 98/01792 has therefore proposed carrying out the production of large-area printing plates by means of an inkjet process. Here, an inkjet printer applies marks for positioning the individual plates on a mounting sheet. After individual photopolymer plates, i.e. plates not yet exposed and developed, have been stuck on, a photomask is applied to the individual photopolymer plates by means of an inkjet printer. The plate composite as a whole is then exposed and developed. The recording of images on photopolymer relief printing plates by means of an inkjet process has been disclosed, for example, also by EP-A 465 949, WO 97/25206 or JP-A 63-109 052.

However, the disadvantage of image recording by means of an inkjet process is the low resolution, which is limited to about 600 dpi in the case of the inkjet printer. The print quality is therefore subject to limits.

It is known that higher resolutions can be achieved by image recording on printing plates by means of IR ablation, for example disclosed by EP-A 767 407 or U.S. Pat. No. 5,262,275. However, these advantages could not be utilized to date in the production of large-format printing plates on a mounting sheet since they were cancelled out by the mounting problems described above and poor registration.

It is an object of the present invention to provide a process which permits the production of large-format composite relief printing plates by direct image recording from a digital data stock with substantially higher resolution than that known in the prior art.

We have found that this object is achieved by the process described at the outset and the composites described at the outset and comprising photopolymerizable relief printing plates.

In the novel process, a dimensionally stable substrate is first provided with marks for positioning the photopolymer printing plates. The term dimensionally stable is to be understood as meaning that the substrate should not distort under the influence of environmental conditions, for example temperature variations or variations in the atmospheric humidity. In particular, those materials which are also advantageously used as substrates for flexographic or letterpress printing plates are employed as dimensionally stable substrates. Examples of such materials are foils of metals such as steel, aluminum, copper or nickel or sheets of plastics such as polyethylene terephthalate (PET), polybutylene terephthalate, polyamide or polycarbonate. Particularly suitable dimensionally stable substrates are polyethylene terephthalate sheets. These substrate sheets are in general from 100 to 500 $\mu$m, preferably from 200 to 500 $\mu$m, for example 250 $\mu$m, thick.

The choice of a suitable method by means of which the dimensionally stable substrate can be provided with positioning marks is not limited. In principle, any method which leaves marks on the substrate which are so clearly visible that these marks are detectable with the naked eye without technical aids can be used. For example, the positioning marks can be applied manually, if necessary assisted by suitable drawing or marking tools. The position of the mark is advantageously calculated by means of a computer with the aid of the layout data stocks. Furthermore, marks can be applied, for example, by means of suitable drawing apparatuses or plotters.

In a preferred embodiment, the positioning marks are written with the aid of an IR laser. This embodiment also comprises the use of a dimensionally stable substrate which is itself laser-structurable. Such a substrate contains components which can interact with the IR laser. The preferred embodiment of the invention furthermore comprises the coating of a dimensionally stable substrate with a laser-structurable layer.

The laser-structurable layer on the substrate is insoluble and preferably also non-swellable in the printing inks used, for example flexographic printing inks based on water, alcohols and esters, and in the developers usually used for developing the relief printing plates, for example those based on chlorinated hydrocarbons or high-boiling hydrocarbon solvents.

The laser-structurable layer on the substrate can be written on by means of an IR laser. Suitable laser-structurable layers are, for example, thermochromic layers which undergo an irreversible color change on exposure to an IR laser, or are IR-ablative layers which are removed or evaporated on exposure to an IR laser, with the result that the substrate underneath becomes visible again.

The thermochromic layers contain thermochromic systems. In general, such thermochromic systems consist of organic layers which, under the influence of activators, for example of free radicals, acids, bases or oxidizing agents, undergo irreversible rearrangement or conversion into a form which has different absorption behavior with respect to light. In this way, an irreversible color change is achieved. Under the influence of heat, the activators result in the conversion of the absorbing substances. Suitable thermochromic systems are disclosed, for example, in DE-A 33 42 579. An example of such a system is Michler's ketone with benzyl tosylate as activator.

Suitable IR-ablative layers on the substrate sheet contain IR-absorbing materials and have high absorption in the wavelength range from 750 to 20000 nm. Furthermore, in the visible range of the spectrum, i.e. in the wavelength range from 400 to 750 nm, the layer has an optical density of at least 0.5, preferably at least 1.0. Examples of suitable IR-absorbing materials are dyes which absorb in the IR range, such as phthalocyanine compounds, and furthermore strongly colored inorganic pigments, such as carbon black, graphite or chromium oxides. The IR-ablative layer on the substrate sheet preferably contains at least one finely divided substance having a high absorption in the wavelength range from 750 to 20000 nm. Suitable substances are in particular finely divided carbon black grades, for example Printex® U (from Degussa), having a mean primary particle size of from 13 to 30 nm.

The laser-structurable layer which is insoluble in printing inks and printing plate developers and is present on the substrate sheet is crosslinked. One or more monomeric or oligomeric compounds may be used as crosslinking components of the layer. The crosslinking can be effected at room temperature, at elevated temperatures or by exposure to actinic light. In the case of radiation-curing, suitable photoinitiators are expediently added. Suitable components for the crosslinking are, for example, monomeric or oligomeric polyfunctional isocyanates mixed with polyfunctional alcohols, for example phenoxy resins. Also suitable are, for example, ethylenically unsaturated compounds, preferably polyethylenically unsaturated compounds, which are capable of free radical polymerization, in combination with photoinitiators. For example, mono- and polyfunctional acrylates and methacrylates, such as butyl acrylate, 2-ethylhexyl acrylate, hexanediol diacrylate, hexanediol dimethacrylate, butanediol dimethacrylate, glycidyl dimethacrylate or mixtures thereof, are particularly suitable.

The laser-structurable layer may contain, for example, polycarbonates, poly(meth)acrylates or poly(meth)acrylic esters as additional binders. Mixtures of different binders may also be used. Said layer may furthermore contain binders and additional assistants, for example plasticizers, dispersants, fillers or surfactants. The layer can advantageously be applied by casting, by dissolving the components of the layer in a suitable solvent, if necessary distributing solids contained therein, for example carbon black, uniformly by dispersing, applying the solvent uniformly to the substrate sheet and evaporating the solvent. If required, the cast layer is then crosslinked at elevated temperatures or by exposure to actinic light. Alternatively, the layer can also be cast on a sheet, dried and crosslinked and this layer then laminated with the substrate sheet, the sheet on which the layer was cast being removed again. Expediently, the coating is applied to an entire web which serves as stock for the production of large-format composite relief printing plates.

With the use of a substrate which is itself laser-structurable, coating with an additional laser-structurable layer can be dispensed with. Laser-structurable substrates contain components which can interact with an IR laser and leave visible traces on the substrate as a result of the interaction. Suitable laser-structurable substrates can be obtained, for example, by incorporating the thermochromic systems described above directly into the substrate sheet during the production of a substrate sheet from a transparent polymer. Furthermore, suitable substrates can be obtained by incorporating IR-absorbing materials having high absorption in the wavelength range from 750 to 20000 nm into the substrate sheet. The sheet containing IR-absorbing materials should have an optical density of at least 0.5, preferably at least 1.0, in the wavelength range from 400 to 750 nm. By exposure to an IR laser, material of the polymer sheet is superficially ablated so that structures are detectable on the substrate sheet. In this process, the laser power must be carefully set. It is chosen so that, on the one hand, visible marks appear on the substrate but on the other hand a reduction in strength or even complete parting of the sheet is avoided. The laser-structurable substrate or the substrate coated with a laser-structurable layer is provided in the next step with positioning marks for the individual photopolymer printing plates comprising an IR-ablative layer by inscribing marks with the aid of IR lasers. Suitable IR lasers for writing on the laser-structurable layer on the substrate are, for example, Nd/YAG lasers (1064 nm) or diode lasers (830 nm). It is possible to use both those laser apparatuses in which the substrate is installed lying flat and those in which the substrate is mounted on a rotating cylinder. Although not absolutely essential, it is advantageous for the novel process to use the same laser apparatuses as those used for subsequently inscribing the image masks. A suitable laser system is, for example, the diode laser system OmniSetter® (from Misomex, laser wavelength 830 nm, working width 1800 mm). Fixing of the substrate sheet with exact positioning in the laser apparatus is of major importance for the quality of the subsequent print. For example, in the case of mounting on a cylinder, the substrate sheets are oriented by means of angle bars or register pins in the exact position on the cylinder and are fixed by means of reduced pressure or double-sided adhesive tape for the laser exposure. This fixing with exact positioning in the laser apparatus is the basis of fixing with exact positioning on the printing cylinder.

For example, the contours of the photopolymer relief printing plates to be applied can be inscribed as positioning marks. However, it is also possible to inscribe angles or crosses which mark the corners of the printing plates. Any marking which makes it possible to position the printing plate unambiguously and precisely is possible. The number, size and position of the individual photopolymer printing plates to be applied to the substrate are advantageously calculated using layout data stocks, and the information for writing the positioning marks is transmitted directly from the computer to the laser system.

In the next step, photopolymer relief printing plates are applied to the substrate with the aid of the positioning marks. The application can be effected by methods known to a person skilled in the art, for example by adhesive bonding with the aid of a double-sided adhesive tape. The individual printing plates are, if required, cut to the required size before application. For the novel process, it is sufficient if the plate has at most only a ½ cm edge on which an image is not to be recorded. The number of individual printing plates depends on the desired printed image. For application of the photopolymerizable printing plates, the substrate advantageously remains fixed in the laser apparatus, for example on the cylinder. This procedure avoids further positioning for inscribing the image masks.

The photopolymerizable relief printing plates are conventional photopolymerizable flexographic or letterpress printing plates which are provided with an IR-ablative layer. Such printing plates are known in principle to a person skilled in the art. They usually comprise a dimensionally stable substrate sheet, at least one photopolymerizable layer and an IR-ablative layer present thereon. The IR-ablative layer has an optical density in the actinic range of at least 2.5 and furthermore possesses high absorption in the infrared range of the spectrum. Advantageously, it contains at least one finely divided substance having a high absorption from 750 to 20000 nm. It may furthermore contain a binder. This is advantageously a film-forming elastomeric binder, for example a polyamide resin (e.g. Makromelt® from Henkel) or a polyvinyl alcohol/polyethylene glycol graft copolymer (e.g. Mowiol® GE 597 from Hoechst). A protective film may additionally be present on the IR-ablative layer. It may also comprise further layers, for example adhesion-promoting layers or non-tacky release layers. The photopolymerizable layer usually comprises binders, ethylenically unsaturated compounds, photoinitiators and, if required, further additives and assistants, for example plasticizers, dyes, antioxidants or thermal polymerization inhibitors. Suitable photopolymerizable relief printing plates having an IR-ablative layer are disclosed, for example, in EP-A 767 407 or U.S. Pat. No. 5,262,275 and are commercially available under the name Cyrel® DPS (from Du Pont) or digiflex® (from BASF).

If required, exposure through the back is carried out in a known manner with the individual photopolymerizable printing plates prior to application.

After the application of the photopolymerizable printing plates to the coated substrate sheet, an image mask is written into the IR-ablative layer of the individual printing plates of the plate composite with the aid of an IR laser or IR laser system. Suitable IR layers for the ablation are, for example, Nd/YAG lasers (1064 nm) or diode lasers (830 nm). Suitable laser systems for the ablation are commercially available, for example the diode laser system OmniSetter® (from Misomex, laser wavelength 830 nm, working width 1800 mm). The image information is transmitted directly from the computer to the laser system.

After the image mask has been inscribed in the IR-ablative layer, the plate composite is exposed uniformly to actinic light. This can be effected either directly on the laser cylinder, or the plate is removed and is exposed in a conventional flat-plate exposure unit (e.g. F IV exposure unit from BASF). The entire exposed plate composite is then developed to give a printing plate. Commercial continuous or rotary washers may be used for this purpose. Depending on the chemistry of the plate, aqueous or organic solvent mixtures are chosen for developing the plate composite. Suitable aqueous solvent mixtures are, for example, water/alcohol mixtures. Suitable organic solvent mixtures are, for example, perchloroethylene/butanol mixtures or Nylosolv® (hydrocarbon/alcohol mixture). In the course of the development, the uncrosslinked components of the photopolymerizable layer are washed out. It is also possible first to remove the residues of the IR-ablative layer with a preliminary developer before developing the plate. The crosslinked, laser-structurable layer on the substrate is retained in the course of development and does not become detached from the substrate. After the development, the entire plate composite is dried. It can then be subjected to conventional aftertreatment methods, for example an aftertreatment with UV-C light or a detackifying treatment with $Br_2$.

By means of the novel process, a composite relief printing plate is produced for each printing color. Said relief printing plates can be mounted quickly and directly on a multicolor printing unit with exact registration and without the adhesively bonded individual printing plates having to be readjusted, and can be printed with excellent registration. The resolution of up to 2540 dpi which is permitted in principle by the laser system can thus also actually be utilized for the multicolor halftone flexographic printing.

The example which follows illustrates the invention without restricting the scope of the invention.

EXAMPLE

The mounting sheet used was a polyethylene terephthalate sheet (Hostaphan® RNH250, Hoechst-Diafoil GmbH) pretreated with trichloroacetic acid (TCA) and having a thickness of 250 µm. The sheet described is transparent and cannot be marked either with an Nd/YAG laser (1064 nm) or with a diode laser (830 nm).

A laser-structurable and simultaneously adhesion-promoting layer was applied to the TCA-treated side of the sheet. Formulation of the adhesion-promoting and laser-structurable layer:

32.0 g of phenoxy resin (polyhydroxyether from Union Carbide)
20.0 g carbon black (Printex U® from Degussa)
38.8 g of isocyanate (Desmodur® L67 from Bayer AG)

The phenoxy resin was dissolved in 1:1 tetrahydrofuran/dioxane. The carbon black and the isocyanate were added to the cold solution and this mixture was dispersed for 30 minutes with the aid of an Ultra-Turrax. The mixture was diluted to a solids content of 7.7% with 1:1 tetrahydrofuran/dioxane and applied to the PET sheet by means of a doctor blade. A coater gap of 100 µm was set and the wet weight of the coating was 65 g/m². The sheet coated in this manner was dried for 7 minutes at 85° C. in a through-circulation dryer. After the coating, the sheet had an optical density of 1.5. This blackening was sufficient to inscribe clearly visible lines of variable width by means of a diode laser or a neodymium-YAG layer.

The mounting sheet (size 1200×1600 mm) was connected at the longer side to a guide rail usual in the printing of corrugated board and was adjusted. The mounting sheet was applied to the cylinder of a diode laser system from Misomex (Omnisetter® 7000, laser wavelength 830 nm, working width 1800 mm ), the cylinder having had to be modified (recessed) for receiving the guide rail. The mounting sheet was fixed to the cylinder by means of reduced pressure. For safety, the edges of the mounting sheet were masked with adhesive tape.

Crossmarks were then produced by means of the laser diodes on the mounting sheet where the printing plates cut to size were subsequently to be positioned. A double-sided adhesive tape was applied to the marked surfaces. For this purpose, adhesive tape is present on an axle arranged coaxially with the cylinder axis. The axle is mounted so that, if required, it can be brought into position and can be swivelled away during exposure to the laser. The position of the adhesive tape roll on the axle can be moved laterally. The adhesive layers were then transferred to the marked surfaces by unrolling, as far as possible without bubbles.

Pieces of photopolymer flexographic printing plates (digiflex® FA II D 284, BASF) which had been cut to exact register beforehand were then applied to the adhesive layers. Before the application, the plate pieces were pre-exposed for 20 seconds from the back. About 30% of the area of the mounting sheet was covered with photopolymer printing plates.

The digiflex® FA II D 284 printing plates had the following composition: a thin adhesion-promoting layer of about 5 µm is present on a 125 µm thick PET substrate sheet. The photosensitive layer is present on said adhesion-promoting layer. The layer sensitive to IR lasers is applied to said photosensitive layer. Said layer sensitive to IR lasers is 2.5 µm thick and comprises about 70% by weight of an elastomeric polyamide (Makromelt 6900 from Henkel) and about 30% by weight of carbon black (Printex® U from Degussa). The optical density of the black layer is 3.2. A 125 µm thick PET cover sheet completes the plate.

After the application of the plate pieces, the cover sheets were removed and information was inscribed on the printing plates by means of the Misomex diode laser (spot size 12.5 µm, laser power 20 W, distributed over 20 laser diodes, rotation 100 rpm, resolution 2032 dpi). 20 minutes were required for inscribing the image masks.

After image recording, the entire printing plate (exposed printing plates on mounting sheet) was removed and was further processed in the conventional manner (i.e. flat). The following steps were carried out:

1. UV exposure, F-III exposure unit from BASF, 15 minutes
2. Washing out of the relief, washout agent nylosolv II from BASF, 30° C., F-IV continuous washer from BASF
3. Drying at 60° C.
4. Post exposure and aftertreatment (UV-C light), 10 minutes in each case For each color separation, a printing plate was produced by this process. The printing plates were clamped on the cylinders of a printing press for corrugated board and printing was carried out using water-based flexographic printing inks. A halftone flexographic print having excellent registration and outstanding resolution was obtained.

The example very clearly shows the particular advantages of the novel process: on the one hand, excellent registration is achieved. The excellent resolution of flexographic printing plates recorded on digitally by means of lasers is also achieved with the composite relief printing plates. In comparison with the use of a single large photopolymer printing plate having an IR-ablative layer on the one hand printing plate material is saved and on the other hand the expensive laser time can be limited to the absolutely essential.

We claim:

1. A process for the production of large-format composite relief printing plates, comprising the following steps:
   (a) providing a dimensionally stable substrate with positioning marks,
   (b) positioning and fastening at least one photopolymerizable relief printing plate having an IR-ablatable layer on the dimensionally stable substrate with the aid of the positioning marks,
   (c) inscribing an image mask into the IR-ablatable layer of the photopolymerizable relief printing plate with the aid of a laser,
   (d) uniformly exposing the entire composite to actinic light,
   (e) washing out the unexposed parts of the photopolymerizable printing plates with a developer
   wherein the dimensionally stable substrate is coated with a laser-structurable layer insoluble in printing inks and printing plate developers, and positioning marks are written into the laser-structurable layer with the use of an IR laser.

2. A process for the production of large-format composite relief printing plates as defined in claim 1, wherein the photopolymerizable relief printing plate having an IR-ablatable layer is a multilayer recording element which comprises at least one dimensionally stable substrate sheet, one photopolymerizable layer and one IR-ablatable layer present thereon.

3. A process for the production of large-format composite relief printing plates as defined in claim 2, wherein the IR-ablatable layer contains, finely distributed in a film-forming binder, at least one substance which has a high absorption in the wavelength range from 750 to 20000 nm and an optical density in the actinic range of at least 2.5.

4. A process for the production of large-format composite relief printing plates as defined in claim 3, wherein the photopolymerizable printing plate additionally comprises, as the top layer, a protective film which is removed before inscribing the image mask.

5. A process for the production of large-format composite relief printing plates as defined in claim 1, wherein the laser-structurable layer on the dimensionally stable substrate contains, in finely divided form, at least one substance which has a high absorption in the wavelength range from 750 to 20000 nm, and the laser-structurable layer has an optical density of at least 0.5 in the visible range of the spectrum.

6. A process for the production of large-format composite relief printing plates as defined in claim 1, wherein the laser-structurable layer contains a thermochromic system.

7. A process for the production of large-format composite relief printing plates as defined in claim 1, wherein a dimensionally stable substrate which is itself laser-structurable is used, and positioning marks are written into the substrate using an IR laser.

8. A process for the production of large-format composite relief printing plates as defined in claim 1, wherein positioning marks are applied manually to the dimensionally stable substrate.

9. A composite of photopolymerizable relief printing plates comprising
   a dimensionally stable substrate,
   a laser-structurable layer applied directly thereon and insoluble in printing inks and printing plate developers, and
   one or more photopolymerizable relief printing plates applied thereon and having an IR-ablatable layer.

10. A composite of photopolymerizable relief printing plates as defined in claim 9, wherein the photopolymerizable relief printing plates comprise at least one dimensionally stable substrate sheet, one photopolymerizable layer and one IR-ablatable layer present thereon.

11. A composite of photopolymerizable relief printing plates as defined in claim 10, wherein the IR-ablatable layer contains, finely distributed in a film-forming binder, at least one substance which has a high absorption in the wavelength range from 750 to 20000 nm and an optical density in the actinic range of at least 2.5.

12. A composite of photopolymerizable relief printing plates as defined in claim 11, wherein the photopolymerizable relief printing plates additionally comprise a protective film as the top layer.

13. A composite of photopolymerizable relief printing plates as defined in claim 9, wherein the laser-structurable layer on the dimensionally stable substrate contains at least one substance which has a high absorption in the wavelength range from 750 to 20000 nm, and the laser-structurable layer has an optical density of at least 0.5 in the visible range of the spectrum.

* * * * *